United States Patent [19]

Satoh

[11] 4,161,040
[45] Jul. 10, 1979

[54] DATA-IN AMPLIFIER FOR AN MISFET MEMORY DEVICE HAVING A CLAMPED OUTPUT EXCEPT DURING THE WRITE OPERATION

[75] Inventor: Takashi Satoh, Kodaira, Japan

[73] Assignee: Hitachi, Ltd., Japan

[21] Appl. No.: 798,865

[22] Filed: May 20, 1977

[30] Foreign Application Priority Data

May 24, 1976 [JP] Japan .................................. 51-59117

[51] Int. Cl.² ............................................... G11C 7/02
[52] U.S. Cl. ................................ 365/203; 307/200 B;
  307/209; 307/DIG. 1; 307/DIG. 4; 365/190;
  365/206
[58] Field of Search ....... 340/173 R, 173 DR, 173 FF;
  307/200 B, 209, 238, 270, DIG. 1, DIG. 4,
  DIG. 5; 365/203, 202, 206, 207, 208, 190, 154,
  229

[56] References Cited

U.S. PATENT DOCUMENTS

| | | | |
|---|---|---|---|
| 3,594,736 | 7/1971 | Hoffman | 340/173 FF |
| 3,938,108 | 2/1976 | Salsbury et al. | 307/DIG. 1 |
| 3,949,383 | 4/1976 | Askin et al. | 340/173 DR |
| 4,019,068 | 4/1977 | Bormann | 307/209 |
| 4,060,740 | 11/1977 | Nishimura | 365/203 |

Primary Examiner—Stuart N. Hecker
Assistant Examiner—Donald McElheny
Attorney, Agent, or Firm—Craig and Antonelli

[57] ABSTRACT

In a MIS random access memory device including a data-in amplifier and MIS memory cells, a device is provided for holding the output level of the data-in amplifier at the precharge potential of the memory cells except during a write operation by controlling an input circuit and a driver circuit of the data-in amplifier through utilizing the read/write signal and the control signal for the memory. Data stored in the memory cells are free from the influence of the output of the data-in amplifier during a non-write operation.

20 Claims, 15 Drawing Figures

DATA-IN AMPLIFIER FOR AN MISFET MEMORY DEVICE HAVING A CLAMPED OUTPUT EXCEPT DURING THE WRITE OPERATION

BACKGROUND OF THE INVENTION

Field of the Invention

This invention relates to a semiconductor memory device, and more particularly to improvements in data-in circuit for a memory device utilizing metal-insulator-semiconductor field-effect transistors (referred to as MISFET or more briefly FET, hereinbelow).

SUMMARY OF THE INVENTION

An object of this invention is to provide a semiconductor memory circuit having a large noise margin or immunity, thereby being free from erroneous operation by a small amount of noise.

Another object of this invention is to provide a semiconductor memory circuit having a high utilization factor of the supply voltage.

Further object of this invention is to provide a semiconductor memory circuit having larger freedom of design.

Another object of this invention is to provide a semiconductor memory circuit having improved reliability.

According to an aspect of this invention, there is provided a semiconductor memory circuit comprising at least a data-in amplifier and a memory cell, wherein arrangement is effected so that the memory content of the memory cell is free from the influence of the output of the data-in amplifier except during a write operation.

The above and other objects, features and advantages of the present invention will become apparent from the following preferred embodiments of the invention when taken in conjunction with the accompanying drawings.

DETAILED DESCRIPTION OF THE INVENTION

Prior to the description of preferred embodiments of this invention general description of the invention will be made with reference to FIGS. 1 through 6.

Figure 1:
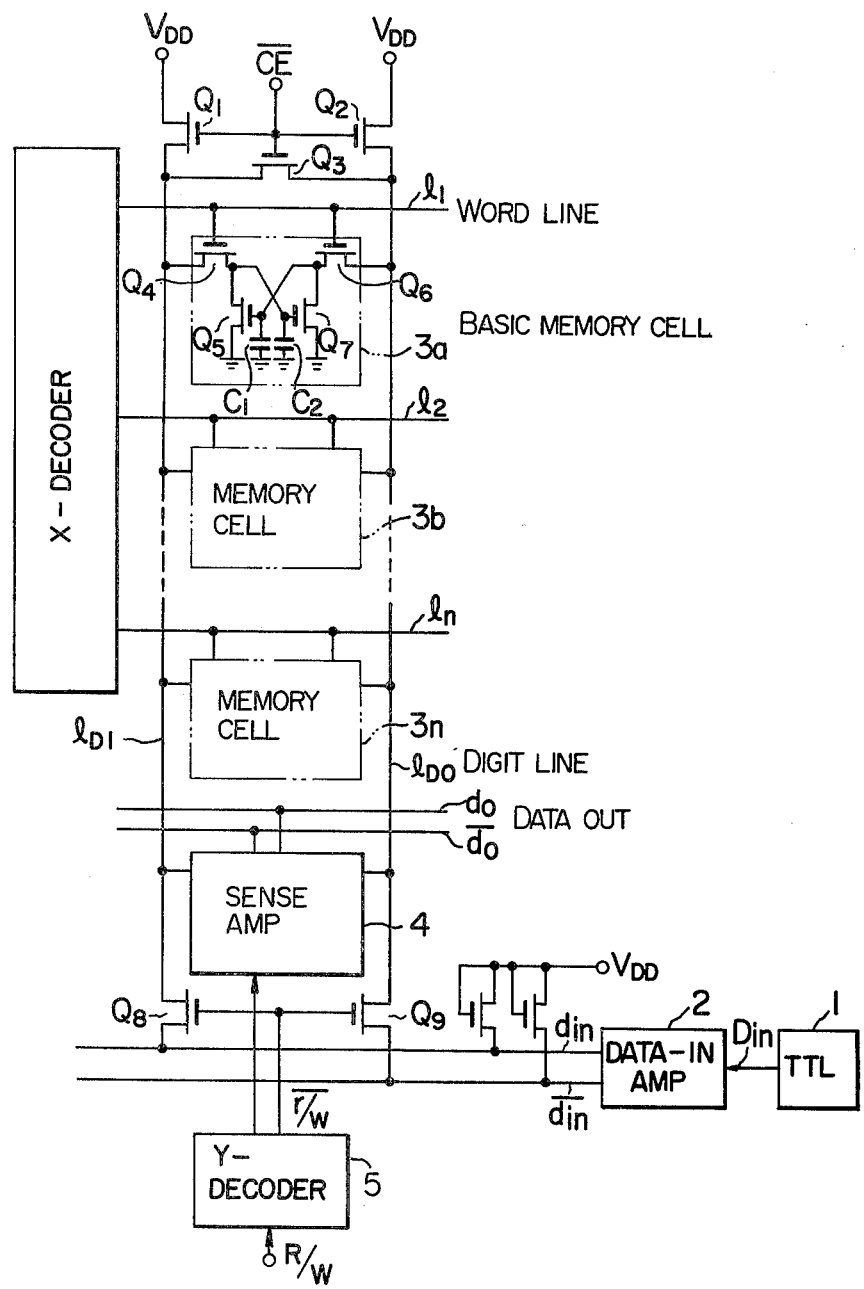
FIG. 1 is a schematic circuit diagram of a memory circuit comprising memory cells, each cell being formed of four transistors.

A semiconductor random access memory circuit as shown in FIG. 1 is studied out and examined by the inventor.

FIG. 1 shows one column of a memory matrix which totally comprises m pairs of digit (or data) lines ($l_{D1}$ and $l_{D0}$), n rows of word lines $l_1$ to $l_n$ and m×n memory cells arranged in a matrix. In the figure, symbols $3a$ to $3n$ denote memory cells. Each basic memory cell $3a$ of the memory matrix includes four FETs $Q_4$ to $Q_7$. The drains of the transfer gate FETs $Q_4$ and $Q_6$ are connected to the digit lines $l_{D1}$ and $l_{D0}$, the gates thereof to the word line $l_1$ and the sources thereof to ground through the FETs $Q_5$ and $Q_7$. The FETs $Q_5$ and $Q_7$ are cross-coupled by connecting the gates of the FETs $Q_5$ and $Q_7$ to the drains of the FETs $Q_7$ and $Q_5$, respectively. The parasitic gate capacitances of the FETs $Q_5$ and $Q_7$ are used as memory capacitances $C_1$ and $C_2$. Other memory cells $3b$ to $3n$ comprise similar structures. A pair of FETs $Q_1$ and $Q_2$ disposed between the digit lines $l_{D1}$ and $l_{D0}$ and the supply voltage source $V_{DD}$ control the precharging of the digit lines $l_{D1}$ and $l_{D0}$. A resetting FET $Q_3$ brings the pair of digit lines $l_{D1}$ and $l_{D0}$ at the same level upon the above-mentioned precharging. The gates of these FETs $Q_1$ to $Q_3$ are applied with the chip non-selection signal $\overline{CE}$ which takes the level $V_{DD}$ during the chip non-selection period. In the figure, a transistor-transistor-logic (TTL) circuit 1 supplies an information signal to the memory device based on an external logic signal. A data-in amplifier 2 receives the output $D_{in}$ of the TTL circuit, amplifies it to the MIS level and supplies a pair of complementary outputs $d_{in}$ and $\overline{d_{in}}$. One of these output or data lines $d_{in}$ is connected to one of the digit lines $l_{D1}$ through a transfer gate FET $Q_8$ and the other output line $\overline{d_{in}}$ to the other digit line $l_{D0}$ through a transfer gate FET $Q_9$. The transfer gate FETs $Q_8$ and $Q_9$ are controlled by a read/write command signal $\overline{r/w}$ which is formed by transforming a read/write signal R/W of TTL level controlled by an external system into an inverted signal of MIS level through a column address decoder (referred to as Y decoder, hereinbelow) 5. A sense or read amplifier 4 supplies read or data outputs $d_0$ and $\overline{d_0}$. This sense amplifier 4 supplies the outputs when and only when the corresponding column is selected by the Y decoder 5. In this arrangement, it is assumed that all the FETs $Q_1$ to $Q_9$ are of n-channel enhancement mode type and that the supply voltage is of positive polarity.

Operation of the memory circuit of FIG. 1 will be described hereinbelow.

First, in the chip non-selection period, signal $\overline{CE}$ is at the $V_{DD}$ level to turn on the precharge controlling FETs $Q_1$ and $Q_2$ and the level equalizing FET $Q_3$. Thus, the digit lines $l_{D1}$ and $l_{D0}$ are precharged to the $V_{DD}-V_{th}$ level to prepare for the read/write operation. In the chip enable period, the signal $\overline{CE}$ falls down to the ground level GND to turn off the FETs $Q_1$, $Q_2$ and $Q_3$ and the write operation of the memory cell is initiated by the application of a write command signal $\overline{r/w}$.

In the write operation, when a column as shown in FIG. 1 is selected, the Y decoder 5 supplies a write command signal r/w of $V_{DD}$ level to turn on the transfer gate FETs $Q_8$ and $Q_9$. Then, writing of information or data is achieved in an arbitrarily selected memory cell. For example, when a word line $l_1$ is selected by an X-decoder (row address decoder), the signal on the digit lines is stored in a selected memory cell 3a connected thereto. Namely, when $V_{DD}$ level is applied to the word line $l_1$, the transfer gate FETs $Q_4$ and $Q_6$ of the memory cell 3a are turned on thereby. For example, when the outputs $d_{in}$ and $\overline{d_{in}}$ of the data-in amplifier 2 are of $V_{DD}$ and GND levels, respectively, the capacitance $C_2$ of the FET $Q_7$ is charged up to the $V_{DD}$ level through the digit line $l_{D1}$ and the conducting FET $Q_4$. Then, the FET $Q_7$ is turned on. On the other hand, the charge, if any, in the capacitance $C_1$ of the FET $Q_5$ is allowed to discharge through the conducting FET $Q_6$ and the data line $l_{D0}$. Then, the FET $Q_5$ is turned off. Thus, the memory cell 3a is maintained in such a state that the level on the side of the data line $l_{D1}$ is $V_{DD}$ and that on the side of the data line $l_{D0}$ is GND. When the write operation of the selected memory cell is terminated by turning off the FETs $Q_4$ and $Q_6$ in this state, the $\overline{CE}$ signal is applied and the digit lines $l_{D1}$ and $l_{D0}$ are precharged again through the FETs $Q_1$ and $Q_2$.

In the read operation, when the column shown in the figure is selected by the Y decoder 5, the sense amplifier 4 of this column is activated and the $\overline{r/w}$ signal falls to the GND level to turn off the transfer gate FETs $Q_8$ and $Q_9$. When the word line $l_1$ has been selected, the information in the memory cell 3a ($C_2$ charged and $C_1$ discharged) is read out by the sense amplifier 4. Namely, since the word line $l_1$ is raised to the $V_{DD}$ level, the gate transfer FETs $Q_4$ and $Q_6$ of the memory cell 3a are turned on. Thus, the charge on the digit line $l_{D0}$ is discharged through the FETs $Q_6$ and $Q_7$, while the digit line $l_{D1}$ is held at the $V_{DD}-V_{th}$ level since the FET $Q_5$ is being turned off. Thus, the charges on the digit lines $l_{D1}$ and $l_{D0}$ correspond to those in the capacitances $C_2$ and $C_1$. These state of the digit lines are sensed by the sense amplifier 4. Therefore, the output of the sense amplifier 4 achieves the reading of the selected memory cell.

Figure 2:
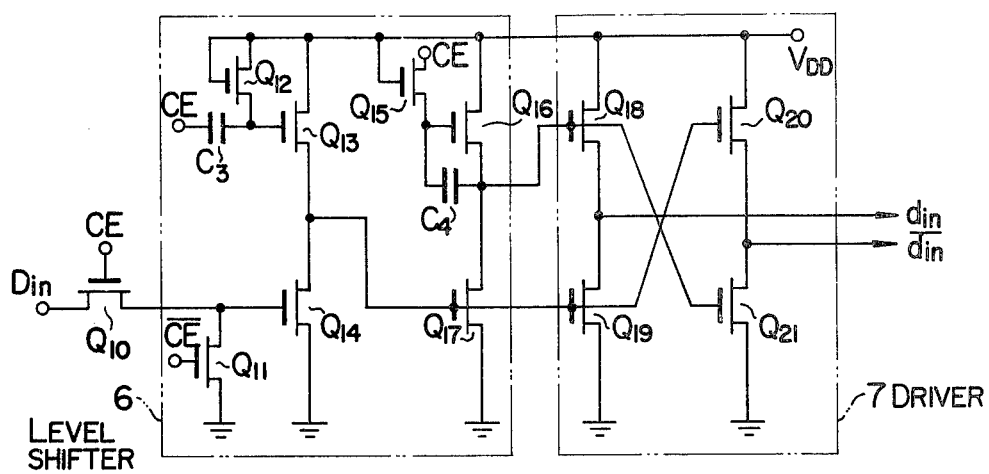
FIG. 2 is a circuit diagram of a data-in amplifier to used in the circuit of FIG. 1.

The circuit structure of the data-in amplifier 2 to be used in the memory circuit of the above structure is shown in FIG. 2.

In the data-in amplifier 2, a level shift circuit 6 comprises a cascade connection of an inverter including FETs $Q_{13}$ and $Q_{14}$ and another inverter including FETs $Q_{16}$ and $Q_{17}$. Each of these inverters of the level shift circuit 6 has a bootstrap structure for sufficiently providing an output of the $V_{DD}$ level. Namely, the chip enable signal CE is applied through a capacitor $C_3$ to the gate of the load FET $Q_{13}$ of the initial stage inverter ($Q_{13}$ and $Q_{14}$) and a reverse current blocking FET $Q_{12}$ having its gate and drain connected in common, i.e. so-called diode-connection transistor, is connected between the gate of the FET $Q_{13}$ and the supply voltage terminal $V_{DD}$. According to the bootstrap effect, when the gate voltage of the FET $Q_{13}$ becomes higher than the supply voltage $V_{DD}$, the FET $Q_{12}$ blocks the reverse current and prevents the level of the voltage across the capacitor $C_3$ from decreasing. A capacitor $C_4$ and a reverse current blocking FET $Q_{15}$ provided to the next stage inverter ($Q_{16}$ and $Q_{17}$) operate in a similar manner to that of the capacitor $C_3$ and the FET $Q_{12}$. An FET $Q_{11}$ provided to the gate of the FET $Q_{14}$ of the input side inverter forcedly secure the output of the level shifter circuit 6 to one value regardless of the input in the chip non-selection period ($\overline{CE}=1$). A transfer gate FET $Q_{10}$ which is turned on in the chip enable period (CE=1) is connected between the TTL circuit 1 and the gate of the FET $Q_{14}$ to transfer the output $D_{in}$ of the TTL circuit 1 to the FET $Q_{14}$ only in the chip enable period. Thus, the level shifter circuit 6 of the above arrangement forms the interface between the TTL level and the MISFET circuit level.

In the output stage of this data-in amplifier 2, a driver circuit 7 is formed with a first inverter including FETs $Q_{18}$ and $Q_{19}$ and a second inverter including FETs $Q_{20}$ and $Q_{21}$. The output of the initial stage inverter ($Q_{13}$ and $Q_{14}$) of the preceding level shifter circuit 6 is applied commonly to the driving FET $Q_{19}$ of the first inverter and to the load FET $Q_{20}$ of the second inverter, while the output of the second stage inverter ($Q_{16}$ and $Q_{17}$) of the preceding level shifter circuit 6 is applied commonly to the load FET $Q_{18}$ of the first inverter and to the driving FET $Q_{21}$ of the second inverter. The outputs of the first and second inverters of this driver circuit 7 are supplied to the digit lines $l_{D1}$ and $l_{D0}$ through FETs $Q_8$ and $Q_9$ as $d_{in}$ and $\overline{d_{in}}$ signals, respectively.

Figure 3:
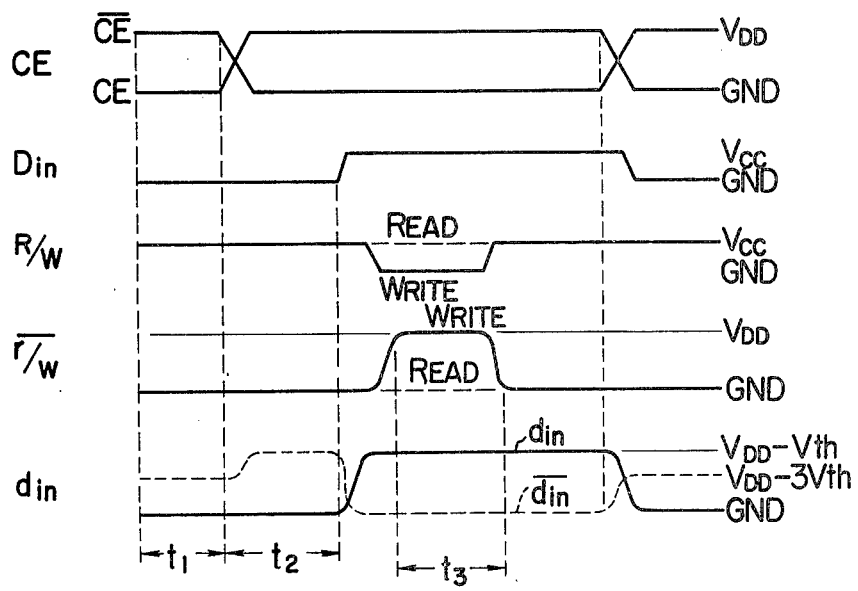
FIG. 3 is a timing chart for explaining the operation of the circuits of FIGS. 1 and 2.

The operation of the data-in amplifier 2 of FIG. 2 in relation with the memory circuit of FIG. 1 will be described more in detail referring to the timing chart of FIG. 3. In the following description, all the FETs are assumed to be of n-channel enhancement mode type and the supply voltage to be of positive polarity.

During the chip non-selection period ($t_1$ in FIG. 3), the FET $Q_{11}$ provided to the input side of the level shifter circuit 6 and applied with the $\overline{CE}$ signal (=1) is turned on and hence the FET $Q_{14}$ is turned off. Thus, the output of the initial stage inverter ($Q_{13}$ and $Q_{14}$) of the level shifter circuit 6 is held approximately at the ($V_{DD}-2V_{th}$) level. In the next stage inverter ($Q_{16}$ and $Q_{17}$) driven by the output of the above initial stage inverter, the FET $Q_{16}$ is turned off and the FET $Q_{17}$ is turned on. Thus, the output of this inverter provides the GND level. Therefore, in the following driver circuit 7, the outputs $d_{in}$ and $\overline{d_{in}}$ of the first and second inverters take the GND and ($V_{DD}-3V_{th}$) levels, respectively, as shown in FIG. 3.

Next, during the chip enable period ($t_2$ in FIG. 3), the CE signal is raised to the $V_{DD}$ level and hence the transfer gate FET $Q_{10}$ is turned on the apply the input $D_{in}$ to the FET $Q_{14}$. Thus, in this period the input signal $D_{in}$ determines the output state of the level shifter circuit 6. When the input signal $D_{in}$ is at the GND level as shown in FIG. 3, the output of the initial stage inverter ($Q_{13}$ and $Q_{14}$) of the level shifter circuit 6 provides the $V_{DD}$ level and that of the next stage inverter ($Q_{16}$ and $Q_{17}$) provides the GND level. The driver circuit 7 is controlled by these outputs. Thus, the output $d_{in}$ of the first inverter ($Q_{18}$ and $Q_{19}$) takes the GND level and the output $\overline{d_{in}}$ of the second inverter ($Q_{20}$ and $Q_{21}$) takes the $V_{DD}-V_{th}$ level. When the input $D_{in}$ rises to a $V_{CC}$ level which is a logical 'High' level, the outputs of the data-in amplifier are inverter ($d_{in}$ rising to the $V_{DD}-V_{th}$ level and $\overline{d_{in}}$ falling to the GND level). These outputs continue till the chip enable signal CE falls down to the GND level.

Then, in the read/write period ($t_3$ in FIG. 3), the read or write operation is performed as described above by the R/W signal. In FIG. 3, the difference in the levels of the read/write selection signal R/W and read/write command signal $\overline{r/w}$ represents the fact that the R/W signal is formed outside the MIS integrated circuit (IC) while the $\overline{r/w}$ signal is formed in the MISIC.

The data-in amplifier of such arrangement, however, is found to be accompanied with the following problems through investigations by the inventor.

(1) In the chip non-selection period ($t_1$ of FIG. 3), the outputs $d_{in}$ and $\overline{d_{in}}$ of this data-in amplifier are held at the GND and $V_D$–3 $V_{th}$ levels, respectively. Therefore, even if a small quantity of noise is superposed on the $\overline{r/w}$ command signal of FIG. 1, the transfer gate FETs $Q_8$ and $Q_9$ may be turned on and thereby deteriorate the precharging level of the digit lines $l_{D1}$ and $l_{D0}$. Thereby, the efficiency of utilization of the supply voltage becomes poor. Namely the utilization factor of the power supply is lowered. Further, the precharge of the digit lines may become insufficient. Then, the memory in the memory cells are influenced and erroneous writing and/or reading may arise.

(2) Even the chip enable period, the outputs of the data-in amplifier in the read operation are held at the levels corresponding to the level of the input signal $D_{in}$. For example, when the input $D_{in}$ is low and if a certain degree of noise is superposed on the read/write command signal $\overline{r/w}$ of FIG. 1, the transfer gate FETs $Q_8$ and $Q_9$ may be turned on. Then, the precharge level of the digit line $l_{D1}$ connected to the $d_{in}$ output (GND level) decreases to cause erroneous operation in the read operation.

The above problems are not limited to such memory devices in which data lines are used in pairs but are common to all kinds of memory circuits. For confirming this situation, the memory circuit as shown in FIG. 4 using each one digit line for each column of the memory matrix is further studied out and investigated by the inventor.

Figure 4:
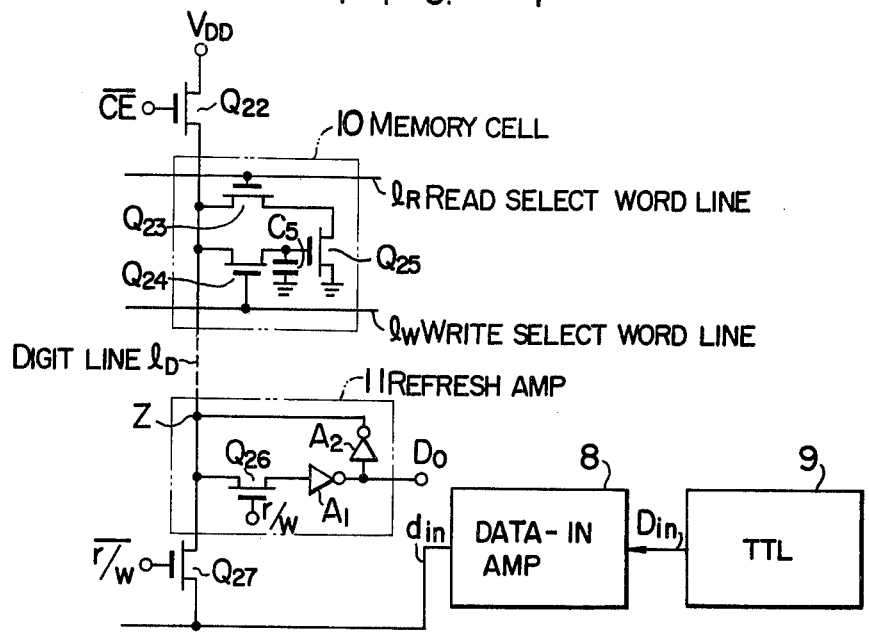
FIG. 4 is a schematic circuit diagram of a semiconductor memory circuit comprising memory cells, each being formed of three transistors.

FIG. 4 shows a dynamic type memory circuit in which three transistors constitute each basic memory cell.

As shown in the figure, a memory cell 10 comprises three FETs $Q_{23}$ to $Q_{25}$. The drains of the FETs $Q_{23}$ and $Q_{24}$ are connected to one digit line $l_D$. The gate of the FET $Q_{23}$ is connected to a read select word line $l_R$ and the gate of the FET $Q_{24}$ to a write select word line $l_W$. The parasitic gate capacitance $C_5$ of the FET $Q_{25}$ is used as the memory capacitance. A refresh circuit 11 comprises a transfer gate FET $Q_{26}$, a sense amplifier $A_1$ and a refresh amplifier $A_2$. The information on the digit line $l_D$ is supplied to the sense amplifier $A_1$ through the transfer gate FET $Q_{26}$ which is controlled by the read signal r/w. The sense amplifier provides the output which is the read-out or data signal $D_0$ and is also fed back to the digit line $l_D$ through the refresh amplifier $A_2$. In the figure, a TTL circuit 9 supplies its output $D_{in}$ to a data-in amplifier 8 which then supplies its output $d_{in}$ to the digit line $l_D$ through an FET $Q_{27}$ controlled by the write signal $\overline{r/w}$. Here, signals r/w and $\overline{r/w}$ in the figure represent read and write signals decoded by an address decoder (not shown). The digital line $l_D$ is precharged by a supply voltage source $V_{DD}$ through an FET $Q_{22}$ when the signal $\overline{CE}$ is high. Although FIG. 4 shows only one column and one row of the memory matrix, the practical form of this memory matrix comprises m columns of data lines, n rows of read select word lines and n rows of write select word lines, and memory cells arranged in m×n matrix.

The operation of the memory circuit of FIG. 4 is mostly similar to that of the circuit of FIG. 1 (difference lying only in the number of data lines).

Figure 5:
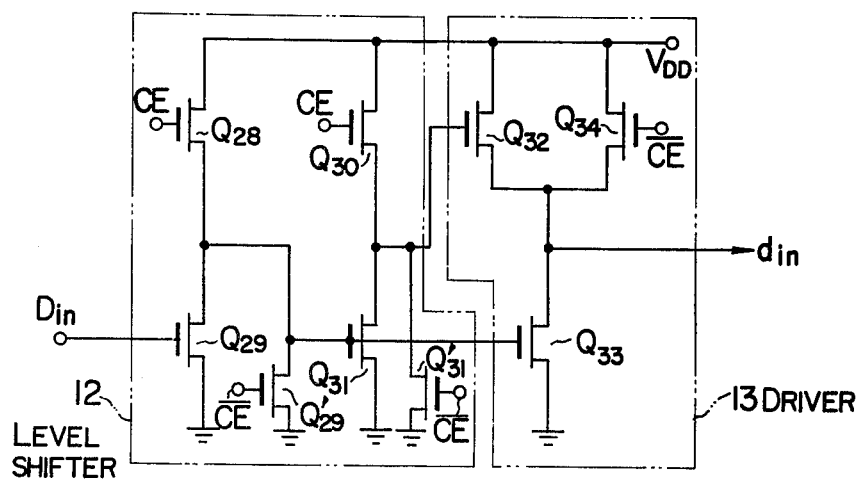
FIG. 5 is a circuit diagram of a data-in amplifier to be used in the circuit of FIG. 4.

FIG. 5 shows the structure of the data-in amplifier 8 to be used in the memory circuit of FIG. 4. In FIG. 5, a level shifter circuit 12 comprises two inverters, one including FETs $Q_{28}$ and $Q_{29}$ and the other including FETs $Q_{30}$ and $Q_{31}$. Grounding FETs $Q_{29}'$ and $Q_{31}'$ are connected in parallel to FETs $Q_{29}$ and $Q_{31}$ respectively and controlled by $\overline{CE}$. A driver circuit 13 comprises a ratioless type inverter including FETs $Q_{32}$ and $Q_{33}$. The output of the level shifter 12 is applied to the gate of the load FET $Q_{32}$ of the driver circuit. This data-in amplifier amplifies the input signal $D_{in}$ of TTL level to MIS level and provides a transformed output $d_{in}$ with the phase unchanged as before.

Such a data-in amplifier as described above is still accompanied with the following problems.

(1) First, assume that the output $d_{in}$ of the data-in amplifier is at the GND level. In the chip non-selection period ($\overline{CE}=V_{DD}$), the precharging FET $Q_{22}$ is turned on to precharge the digit line $l_D$. In this state, if noise is superposed on the $\overline{r/w}$ signal, the FET $Q_{27}$ may be turned on. Then, the precharging level of the data line $l_D$ decreases by the influence of the GND level of the output $d_{in}$ to lower the efficiency of the utilization of the supply voltage and the write level. Thus, the refreshing performance is deteriorated.

Figure 6:
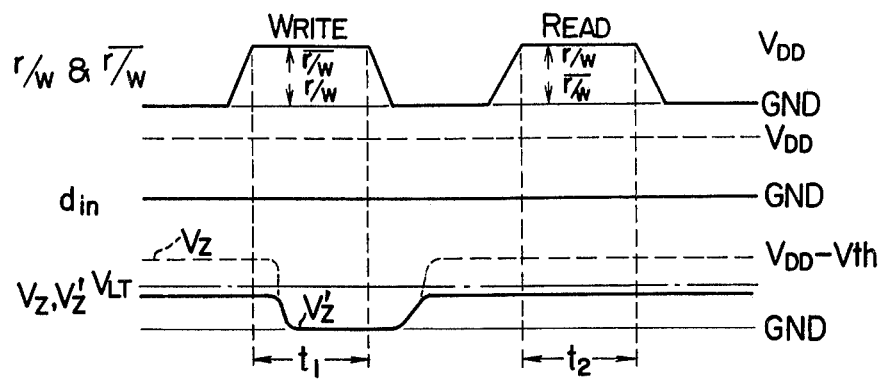
FIG. 6 is a timing chart for explaining operation of the circuits of FIGS. 4 and 5.

(2) If the precharging level has been lowered as described above, the voltage $V_Z$ at the connecting node Z of the refreshing circuit 11 with the digit line $l_D$ decreases from the $V_{33}-V_{th}$ level to the level of $V_Z'$ as shown in the timing chart of FIG. 6. Then, even if the normal write operation is achieved in the write operation period ($t_1$ in FIG. 6), during the precharge period ($\overline{CE}=1$) the output $V_Z$ may not reach the threshold voltage $V_{LT}$ of the sense amplifier $A_1$. Thus, erroneous reading may arise in the read operation period ($t_2$ in FIG. 6). This lowers the reliability and give restrictions on the circuit design.

It will be apparent that the above problems also arise in the memory circuit comprising memory cells each including one transistor and that it arises not only in the case of using the output of a TTL circuit as $D_{in}$ as in the above examples but also in the case of forming the input $D_{in}$ by a MISIC.

Figure 7:
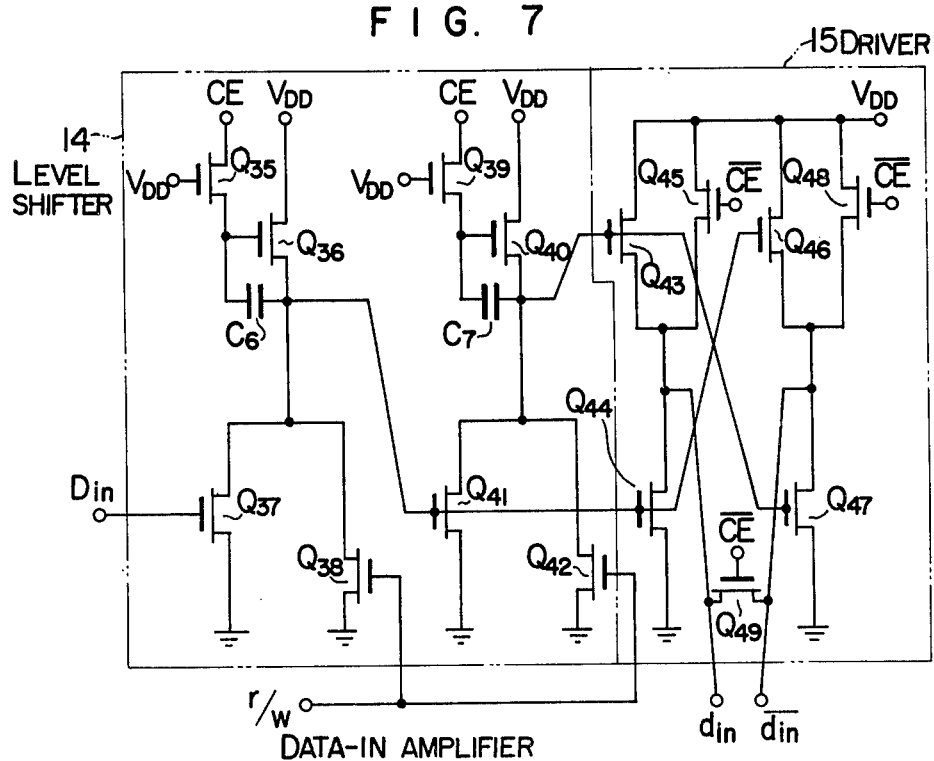
FIG. 7 is a circuit diagram of a data-in amplifier according to one of the preferred embodiments of this invention.

FIG. 7 shows a data-in amplifier according to a preferred embodiment of this invention.

The data-in amplifier comprises a level shifter circuit 14 and a driver circuit 15. The level shifter circuit 14 comprises a first inverter including a load FET $Q_{36}$ and a drive FET $Q_{37}$ and a second inverter including a load FET $Q_{40}$ and a driver FET $Q_{41}$. An input signal $D_{in}$ is applied to the first inverter and the output of this first inverter is applied to the input of the second inverter. To the load FETs of these inverters, are provided capacitors $C_6$ and $C_7$ for bootstrap effect and reverse current blocking FETs $Q_{35}$ and $Q_{39}$. Namely, the gate of the FET $Q_{36}$ ($Q_{40}$) is connected to the source thereof through a capacitance $C_6$ ($C_7$) and a reverse current blocking FET $Q_{35}$ ($Q_{39}$) controlled by the chip enable signal CE is connected between the gate of the FET $Q_{36}$ ($Q_{40}$) and the terminal to which the chip enable signal CE is applied. Further, another FET $Q_{38}$ ($Q_{42}$) is connected in parallel with the driver FET $Q_{37}$ ($Q_{41}$) of the inverter and is controlled by the r/w signal which takes the GND level only in the write operation and the $V_{DD}$ level in other periods. Such r/w signal may be an inverted signal of the $\overline{r/w}$ signal as shown in FIG. 1.

The driver circuit 15 comprises a first inverter including a load FET $Q_{43}$ and a driver FET $Q_{44}$, and a second inverter including a load FET $Q_{46}$ and a driver FET $Q_{47}$. A precharging FET $Q_{45}$ ($Q_{48}$) controlled by the chip non-selection signal $\overline{CE}$ is connected in parallel with the load FET $Q_{43}$ ($Q_{46}$) for bringing the $d_{in}$ and $\overline{d_{in}}$ signals up to the same level in the $l_{D1}$ and $l_{D0}$ signal levels in the chip non-selection period. The output of the second inverter ($Q_{40}$ and $Q_{41}$) of the level shifter 14 is applied commonly to the load FET $Q_{43}$ of the first inverter and the driver FET $Q_{47}$ of the second inverter of the driver circuit 15, while the output of the first inverter ($Q_{36}$ and $Q_{37}$) of the level shifter 14 is applied commonly to the drive FET $Q_{44}$ of the first inverter and the load FET $Q_{46}$ of the second inverter of the driver circuit 15. The outputs $d_{in}$ and $\overline{d_{in}}$ of this data-in amplifier are derived from the first and second inverters of the driver circuit 15. Thus, a ratioless output can be derived from the driver circuit 15. An FET $Q_{49}$ is connected between the output lines $d_{in}$ and $\overline{d_{in}}$ to ensure the operation of the circuit by holding the two output levels at the same high level in the chip non-selection period ($\overline{CE} = V_{DD}$).

The data-in amplifier of the above structure can be embodied in the memory circuit comprising fourtransistor memory cells as shown in FIG. 1. The operation of the circuit in such case will be described hereinbelow. Here, all the FETs are assumed to be of n-channel enhancement mode type and the voltage source to be of positive polarity.

Figure 8A:
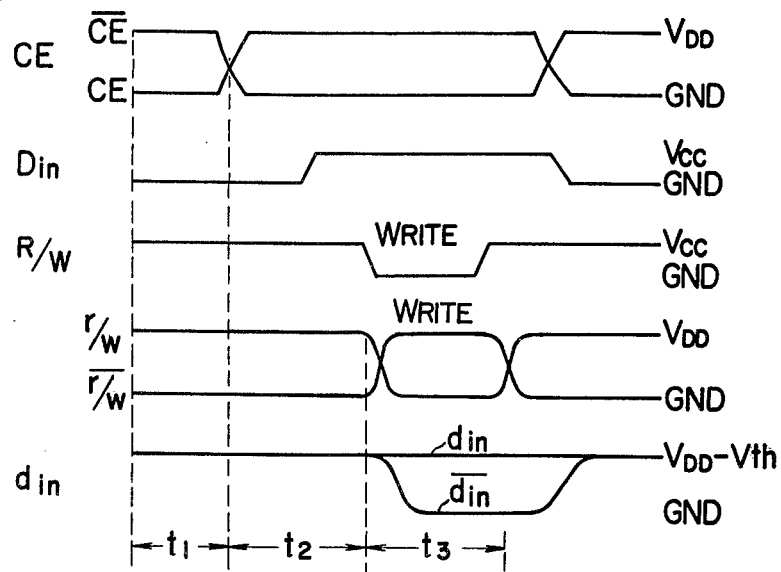
FIGS. 8A and 8B are timing charts for explaining the operation of the circuit of FIG. 7.
Figure 8B:
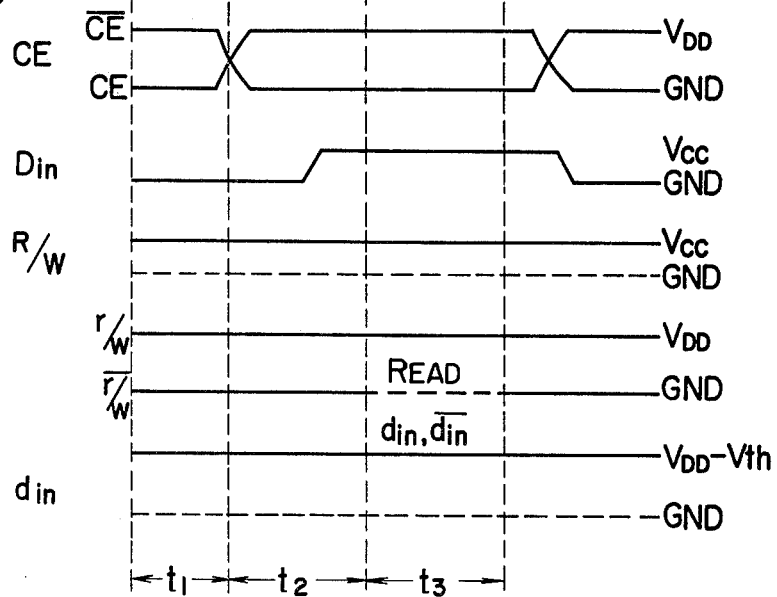

FIGS. 8A and 8B are timing charts for explaining the operation of the data-in amplifier of FIG. 7 embodied in the memory circuit of FIG. 1. Descriptions having been made in the foregoing and also holding in this case will be omitted for avoiding repeated description.

(1) In the write operation (FIG. 8A):

In the data-in amplifier of FIG. 7, the r/w signal (inverted signal of the read/write signal $\overline{r/w}$) in the chip non-selection period ($\overline{CE} = V_{DD}$, $t_1$ in FIG. 8A) takes the $V_{DD}$ level. Thus, the FETs $Q_{38}$ and $Q_{42}$ provided on the driver side of the respective inverters of the level shifter 14 are turned on to forcedly secure the outputs of the respective inverters to the GND level. The FETs $Q_{43}$, $Q_{47}$, and $Q_{44}$, $Q_{46}$ of the drive circuit 15 applied with such GND level are thereby turned off. The FETs $Q_{45}$ and $Q_{48}$ applied with the chip non-selection signal $\overline{CE}$ are both turned on and the FET $Q_{49}$ connected to the output lines and applied with $\overline{CE}$ signal is also turned on. As a result, the outputs $d_{in}$ and $\overline{d_{in}}$ of the data-in amplifier are both held at the $V_{DD}-V_{th}$ level.

Next, even when the chip enable signal CE becomes of $V_{DD}$ level and the FETs $Q_{36}$ and $Q_{40}$ provided on the load sides of the respective inverters of the level shifter 14 are turned on, the outputs $d_{in}$ and $\overline{d_{in}}$ of the data-in amplifier are both held still at the $V_{DD}-V_{th}$ level and unchanged due to the conducting FETs $Q_{38}$ and $Q_{42}$ unless the r/w signal is changed (i.e. during $t_2$ in FIG. 8A).

When the write signal is applied (the $\overline{r/w}$ signal is at the $V_{DD}$ level, period $t_3$ in FIG. 8A), the r/w signal is at the GND level and hence the FETs $Q_{38}$ and $Q_{42}$ provided on the driver sides of the respective inverters of the level shifter 14 are turned off. In this state, since the output $D_{in}$ from the TTL circuit is at the $V_{CC}$ level, the FET $Q_{37}$ of the input side inverter is turned on and hence the output of this inverter is at the GND level. On the other hand, the driver FET $Q_{41}$ of the next stage inverter applied with this GND level is turned off. Thus, the output of this inverter becomes of $V_{DD}$ level. Therefore, in the driver circuit 15, the FETs $Q_{44}$ and $Q_{46}$ applied with the output (GND level) of the input side inverter are turned off, while the FETs $Q_{43}$ and $Q_{47}$ applied with the output ($V_{DD}$ level) of the next stage inverter are turned on. Further, since the $\overline{CE}$ signal is at the GND level, the FETs $Q_{45}$ and $Q_{48}$ are turned off. As a result, one output $d_{in}$ of the data-in amplifier becomes of $V_{DD}-V_{th}$ level and the other $\overline{d_{in}}$ of GND level. Write operation into the memory cells is achieved under such write conditions.

(2) In the read operation (FIG. 8B):

In the data-in amplifier of FIG. 7, in the chip non-selection period ($\overline{CE} = V_{DD}$, period $t_1$ in FIG. 8B), the r/w signal is at the $V_{DD}$ level and the FETs $Q_{38}$ and $Q_{42}$ of the respective inverters of the level shifter 14 are turned on to forcedly secure the outputs of the respective inverters at the GND level. Therefore, the outputs $d_{in}$ and $\overline{d_{in}}$ of the driver circuit 15 controlled by these outputs (GND level) of these inverters are both held at the $V_{DD}-V_{th}$ level by the conducting FETs $Q_{45}$ and $Q_{48}$.

Next, even when the chip enable signal CE becomes of $V_{DD}$ level and the FETs $Q_{36}$ and $Q_{40}$ provided to the respective inverters of the level shifter circuit 14 are turned on, the outputs of the respective inverters are forcedly secured at the GND level in this period $t_2$ since the r/w signal is continuously held at the $V_{DD}$ level. Therefore, the outputs $d_{in}$ and $\overline{d_{in}}$ of the driver circuit 15 are continuously held at the floating $V_{DD}-V_{th}$ level similar to the preceding period. Further, in the read operation of the memory circuit, i.e. when the read signal $\overline{r/w}$ is at the GND level (period $t_3$ in FIG. 8B), the r/w signal is still at the $V_{DD}$ level and hence the output state of this data-in amplifier is not changed and the $d_{in}$ and $\overline{d_{in}}$ signals are both at the floating $V_{DD}-V_{th}$ level.

Summarizing the above, according to the data-in amplifier of this embodiment, the output state is determined by the input signal $D_{in}$ in the write operation of the memory circuit, but both the outputs $d_{in}$ and $\overline{d_{in}}$ are forcedly secured at the $V_{DD}-V_{th}$ level in other periods than the write operation period (i.e., in the chip non-selection period and in the read operation). This constitutes a feature of this invention.

The manner how the intended objects of this invention are achieved will be described in more detail in connection with the memory circuit of FIG. 1 together with other effects of this invention.

(1) In the chip non-selection period ($\overline{CE} = V_{DD}$, period $t_1$ in FIGS. 8A and 8B), the outputs $d_{in}$ and $\overline{d_{in}}$ of the data-in amplifier are both at the $V_{DD}-V_{th}$ level. Therefore, even if a small amount of noise is superposed on the read/write signal $\overline{r/w}$ of the memory circuit of FIG. 1 to turn on the transfer gate FETs $Q_8$ and $Q_9$, the precharge levels of the digit lines $l_{D1}$ and $l_{D0}$ are free from the lowering effect due to the pulling action to the GND level. Thus, the utilizaton efficiency of the supply voltage does not drop. Further, since the precharging level is held sufficiently high, the write-in level for the memory cells is sufficiently high. Therefore, the memory content of the memory cells is free from the bad effect and no erroneous writing or reading can occur.

(2) In the chip enable period ($CE = V_{DD}$), even when noises are superposed on the $\overline{r/w}$ signal of FIG. 1 to turn on the FETs $Q_8$ and $Q_9$, the precharging levels of the digit lines are held sufficiently high since the outputs $d_{in}$ and $\overline{d_{in}}$ of the data-in amplifier are at the $V_{DD}-V_{th}$ level. Therefore, the signal levels in the write operation can never be deteriorated and the utilization factor of the supply voltage is improved.

(3) In the read operation period (period $t_3$ in FIGS. 8A and 8B), even when noises are superposed on the $\overline{r/w}$ signal of FIG. 1 to turn on the FETs $Q_8$ and $Q_9$, the outputs $d_{in}$ and $\overline{d_{in}}$ of the data-in amplifier are both at the floating $V_{DD}-V_{th}$ level and hence there is no possibility of causing any change in the memory content of the memory cells and of erroneous reading.

(4) As has been described above, since the memory circuit becomes almost free from the erroneous operation by noises, the reliability is improved. Further, since there is no strict restriction in the timing of writing, reading and word selection in relation with the output state of the data-in amplifier, the freedom of design is improved.

(5) Further, when the outputs $d_{in}$ and $\overline{d_{in}}$ of the data-in amplifier are held at the $V_{DD}-V_{th}$ level in all the periods except the write operation as in the preceding embodiments, the write operation can be achieved more rapidly (due to the fact that the discharging action is generally faster than the charging action in a capacitance in the MISFET).

(6) Yet further, since the data-in amplifier of the above embodiment comprises the FET $Q_{49}$ connected between the output terminals of $d_{in}$ and $\overline{d_{in}}$, the outputs $d_{in}$ and $\overline{d_{in}}$ are securely held at the same $V_{DD}-V_{th}$ level in the chip non-selection period. Namely, even when there exists unbalance in the impedance of the FETs constituting the output inverters, etc., this FET $Q_{49}$ connected between the two output lines bring the two outputs $d_{in}$ and $\overline{d_{in}}$ at the same level. This also improves the yield of the products in manufacture.

This invention is not limited to the above embodiment and many alternations or modifications can be made.

Figure 9:
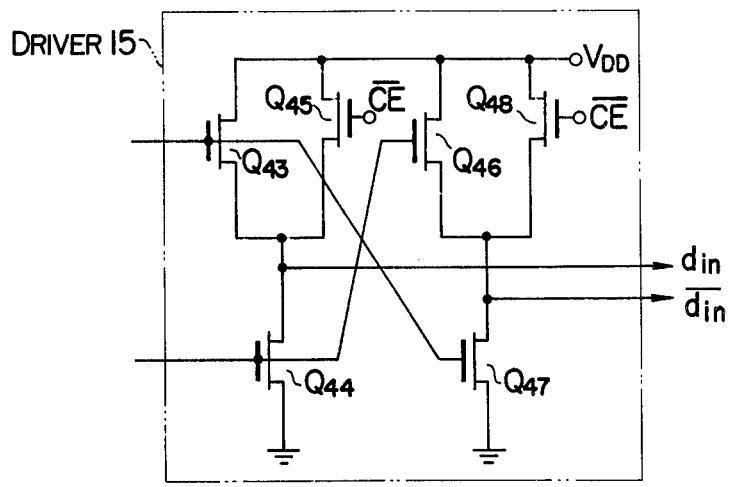
FIG. 9 is a circuit diagram of another example of a driver circuit to be used in the circuit of FIG. 7.

For example, although, in the above embodiment, the FET $Q_{49}$ which is turned on in the chip non-selection period is provided between the $d_{in}$ and $\overline{d_{in}}$ output terminals for ensuring the effect of this invention, it may not necessarily be provided. Alternatively, the outputs of the driver circuit 15 without such FET may be directly used as the $d_{in}$ and $\overline{d_{in}}$ signals as shown in FIG. 9. The driver circuit of FIG. 9 is similar to that of FIG. 7 except the absence of the equalizing FET $Q_{49}$.

Figure 10:
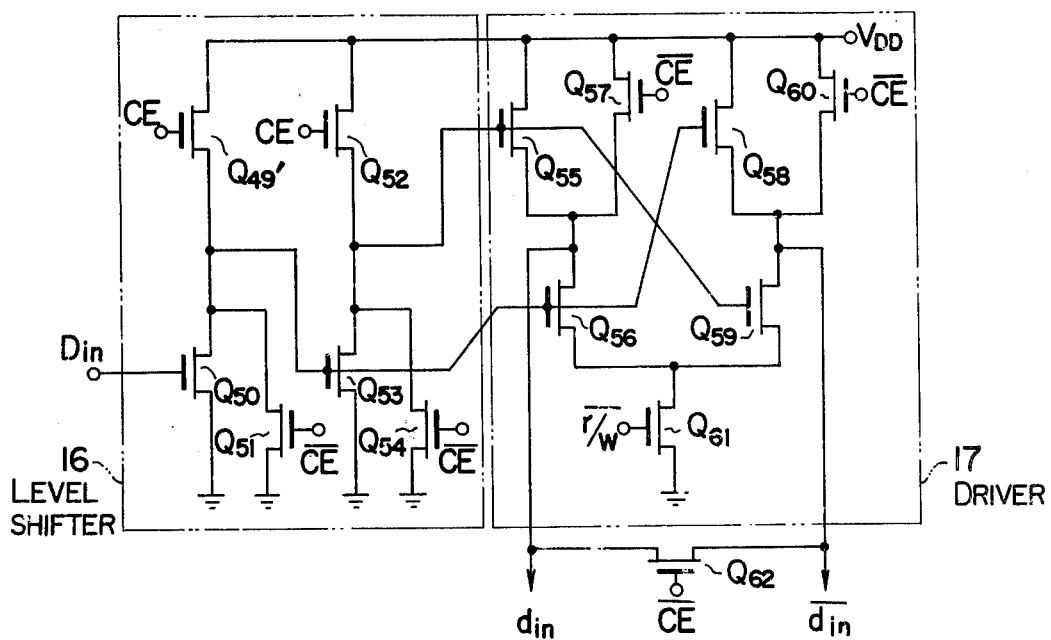
FIG. 10 is a circuit diagram of a data-in amplifier according to another preferred embodiment of this invention.

Further, the data-in amplifier may also have a structure as shown in FIG. 10. The circuit of FIG. 10 is based on the similar technical concept as that of the circuit of FIG. 7. The details of the structure will be described below.

A level shifter circuit 16 comprises a cascade connection of two inverters; one being the input stage inverter including a load FET $Q'_{49}$ which is turned on in the chip enable period ($CE=V_{DD}$) and a driver FET $Q_{50}$ which is applied with the input signal $D_{in}$ and the other being the next stage inverter including a load FET $Q_{52}$ which is turned on in the chip enable period ($CE=V_{DD}$) and a driver FET $Q_{53}$ applied with the output of the input stage inverter. In parallel with the driving FETs $Q_{50}$ and $Q_{53}$ of these inverters, are connected FETs $Q_{51}$ and $Q_{54}$ which are controlled by the chip non-selection signal $\overline{CE}$. A driver circuit 17 comprises also a first and a second inverter. The first inverter comprises a load FET $Q_{55}$ and a driving FET $Q_{56}$ and the second inverter comprises a load FET $Q_{58}$ and a driving FET $Q_{59}$. One of the outputs of the level shifter circuit 16 is applied commonly to the load FET $Q_{55}$ of the first inverter and to the driving FET $Q_{59}$ of the second inverter, while the other output of the level shifter circuit 16 is applied commonly to the driving FET $Q_{56}$ of the first inverter and to the load FET $Q_{58}$ of the second inverter. In parallel with the load FETs $Q_{55}$ and $Q_{58}$, are connected FETs $Q_{57}$ and $Q_{60}$ which are controlled by the chip non-selection signal $\overline{CE}$. Further, for achieving the objects of this invention, the driving FETs $Q_{56}$ and $Q_{59}$ of the first and second inverters are first connected in common and then grounded through an FET $Q_{61}$ which is controlled by the read/write signal $\overline{r/w}$. Thus, the first and second inverters serve as ratioless type inverters. Further, an FET $Q_{62}$ connected between the output terminals $d_{in}$ and $\overline{d_{in}}$ brings the outputs $d_{in}$ and $\overline{d_{in}}$ at the same level in the chip non-selection period for ensuring the effect of this invention similar to the FET $Q_{49}$ in the circuit of FIG. 7.

It will be apparent from the following description of the circuit operation that the data-in amplifier of the above structure achieves similar effects as those of the circuit of FIG. 7. In the following description of the operation, all the FETs are assumed to be of n-channel enhancement mode type and the voltage source to be of positive polarity similar to the foregoing embodiments.

Figure 11:
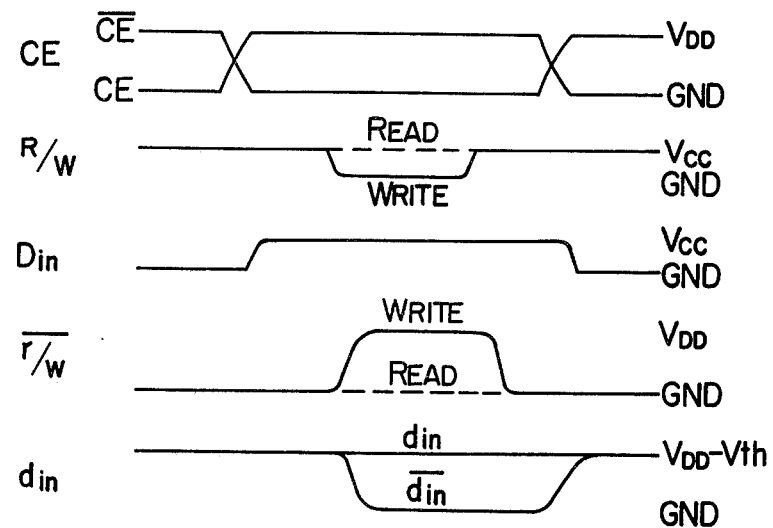
FIG. 11 is a timing chart for explaining the operation of the circuit of FIG. 10.

FIG. 11 is a timing chart for explaining the operation of the circuit of FIG. 10. First, in the chip non-selection period ($\overline{CE}=V_{DD}$), the FETs $Q_{51}$ and $Q_{54}$ provided in parallel with the driver FETs $Q_{50}$ and $Q_{53}$ of the respective inverters of the level shifter circuit 16 are turned on to forcedly secure the outputs of these inverters to the GND level. Therefore, the FETs $Q_{55}$ and $Q_{59}$ and the FETs $Q_{56}$ and $Q_{58}$ of the driver circuit 17 applied with these GND level signals are turned off. But the FETs $Q_{57}$ and $Q_{60}$ controlled by the $\overline{CE}$ signal are turned on. Further, since the $\overline{r/w}$ signal is at the GND level, the FET $Q_{61}$ is turned off. Therefore, the outputs $d_{in}$ and $\overline{d_{in}}$ are both at the $V_{DD}-V_{th}$ level and are stably held at the same level by the FET $Q_{62}$.

Next, when the chip enable signal CE rises to the $V_{DD}$ level, the outputs of the level shifter circuit 16 are determined depending on the input signal $D_{in}$. Namely, when the input signal $D_{in}$ rises to the $V_{CC}$ level, the FET $Q_{50}$ applied with this input signal is turned on and hence the output of the input stage inverter ($Q_{49}$ and $Q_{50}$) is at the GND level. The FET $Q_{53}$ applied with thin GND level is turned off and hence the output of the next stage inverter ($Q_{52}$ and $Q_{53}$) is at the $V_{DD}$ level. Therefore, the FETs $Q_{55}$ and $Q_{59}$ of the driver circuit 17 applied with this $V_{DD}$ level are turned on and the FETs $Q_{56}$ and $Q_{58}$ of the driver circuit 17 applied with the GND level are turned off. In the read operation, the $\overline{r/w}$ signal is at the GND level. Thus even when the FET $Q_{59}$ is turned on, the drain of the FET $Q_{59}$ is still held at the precharging level since the FET $Q_{61}$ connected on the ground side is turned off. Therefore, both the outputs $d_{in}$ and $\overline{d_{in}}$ of the driver circuit 17 are at the $V_{DD}-V_{th}$ level.

In the write operation, the $\overline{r/w}$ signal is high and hence the FET $Q_{61}$ connected on the ground side of the driver circuit 17 is turned on. Then, the data-in amplifier supplies such outputs $d_{in}$ and $\overline{d_{in}}$ which are controlled by the input signal $D_{in}$. Thus, normal write operation is achieved.

According to the embodiment of the data-in amplifier of FIG. 10, the outputs $d_{in}$ and $\overline{d_{in}}$ of the data-in amplifier are forcedly held at the $V_{DD}-V_{th}$ level except during the write operation mode as has been described above. Thus, the embodiment of FIG. 10 provides similar effects as those of the embodiment of FIG. 7.

The embodiments of FIGS. 7, 9 and 10 are adapted for use in the MIS memory device disclosed in co-pending U.S. Patent Application, Ser. No. 692,366, abandoned, of the present assignee, filed on June 3, 1976 based on Japanese Pat. application Ser. No. 50-66566.

Figure 12:
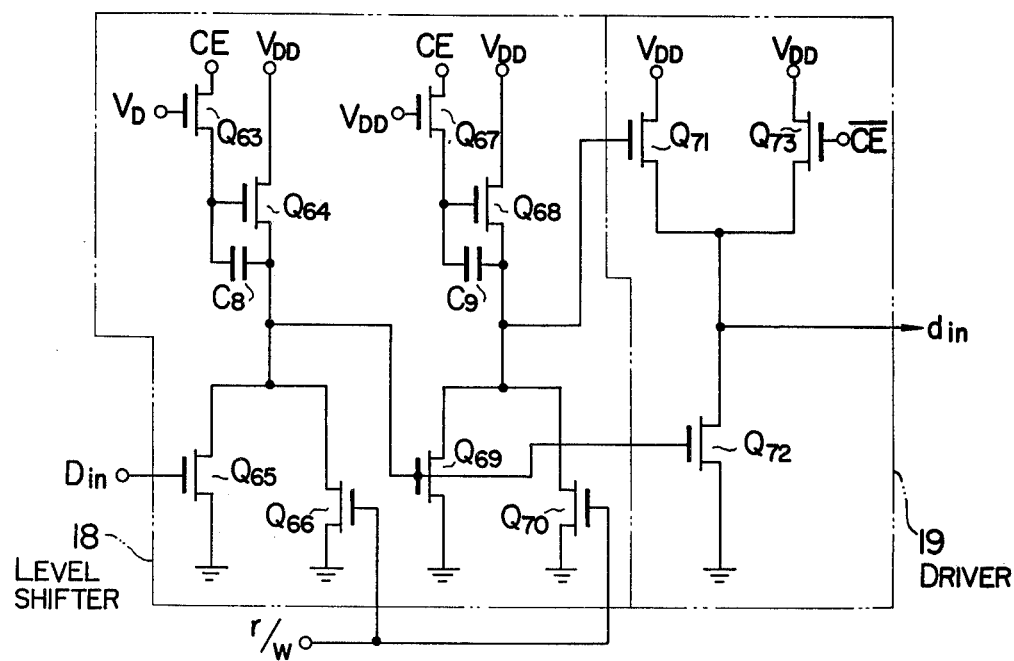
FIG. 12 is a circuit diagram of a data-in amplifier according to another preferred embodiment of this invention.
Figure 13:
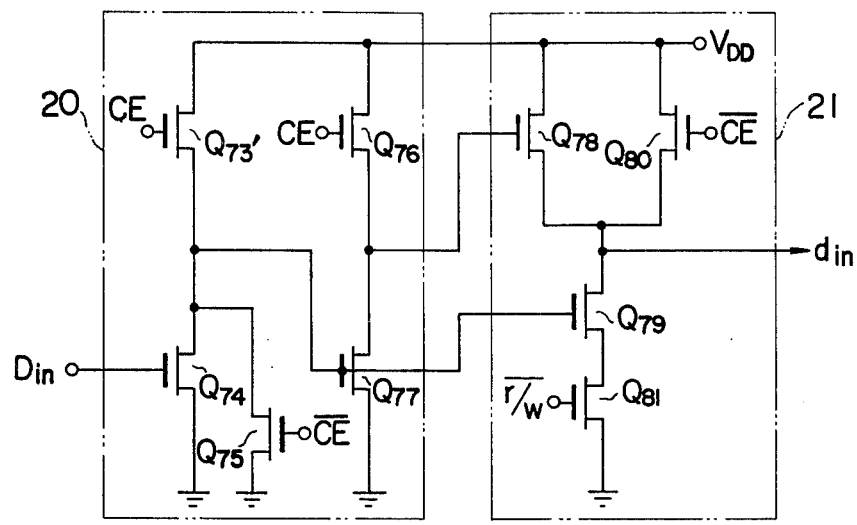
FIG. 13 is a circuit diagram of a data-in amplifier according to another preferred embodiment of this invention.

In the above embodiments, the data-in amplifier provides two outputs $d_{in}$ and $\overline{d_{in}}$ which are applied to a pair of digit lines $l_{D1}$ and $l_{D0}$ of the memory circuit. In other words, the data-in amplifiers of the above embodiments are adapted for use in the memory circuit comprising pairs of digit lines. This invention is not limited to such memory circuits but is also applicable to such memory circuits which use each one digit line for each column of memory cells as is shown in FIG. 4. Examples of such type of data-in amplifier based on the similar technical concept are shown in FIGS. 12 and 13. The circuits of FIGS. 12 and 13 will be briefly described hereinbelow.

In the data-in amplifier of FIG. 12, a level shifter circuit 18 comprises a cascade connection of two inverters, one including FETs $Q_{64}$ and $Q_{65}$ and the other including FETs $Q_{68}$ and $Q_{69}$. For affording the bootstrap effect to the respective inverters, capacitors $C_8$ and $C_9$ are provided to the load FETs $Q_{64}$ and $Q_{68}$, respectively, and also reverse current blocking FETs $Q_{63}$ and $Q_{67}$ are provided to these FETs $Q_{64}$ and $Q_{68}$. Further, for achieving the objects of this invention, FETs $Q_{66}$ and $Q_{70}$ which are controlled by the signal r/w of the read/write signal are connected in parallel with the driving FETs $Q_{65}$ and $Q_{69}$. A driver circuit 19 comprises an inverter including FETs $Q_{71}$ and $Q_{72}$. An FET $Q_{73}$ controlled by the chip non-selection signal $\overline{CE}$ is connected to the output node of this inverter for providing a ratioless output from this driver circuit 19. An input signal $D_{in}$ is applied to the input of the former stage inverter ($Q_{64}$ and $Q_{65}$) of the level shifter circuit 18. The output of this inverter ($Q_{64}$ and $Q_{65}$) is applied to the other inverter ($Q_{68}$ and $Q_{69}$) on one hand and to the driving FET $Q_{72}$ of the driver circuit 19 on the other hand. The load FET $Q_{71}$ of the driver circuit 19 is applied with the output of the other inverter ($Q_{68}$ and $Q_{69}$). An output $d_{in}$ is derived from the output node of the inverter of the driver circuit 19.

Figure 14:
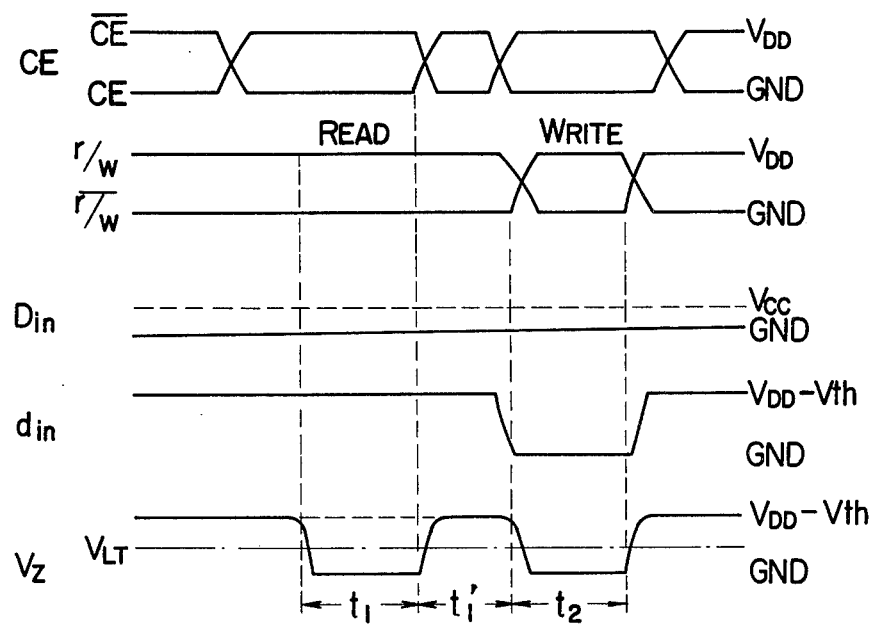
FIG. 14 is a timing chart for explaining the operation of the circuits of FIGS. 12 and 13.

FIG. 14 is a timing chart for explaining the operation of the circuit of FIG. 12. The following description will be made mainly on the operation of the circuit in the period when the input signal $D_{in}$ is at the GND level since the problem lies in the operation under such condition as described in connection with FIG. 6.

First, in the chip non-selection period ($\overline{CE}=V_{DD}$), the r/w signal is at the $V_{DD}$ level and hence the FETs $Q_{66}$ and $Q_{70}$ connected in parallel with the driving FETs $Q_{65}$ and $Q_{69}$ of the respective inverters of the level shifter circuit 18 are turned on. Thus, the outputs of the input side inverter ($Q_{64}$ and $Q_{65}$) and the next stage inverter ($Q_{68}$ and $Q_{69}$) are both at the GND level. Thereby, the load FET $Q_{71}$ and the driving FET $Q_{72}$ of the driver circuit 19 are both turned off, while the precharging FET $Q_{73}$ controlled by the $\overline{CE}$ signal is turned on. Therefore, the output signal $d_{in}$ is at the $V_{DD}-V_{th}$ level.

Next, in the read operation mode (period $t_1$ in FIG. 14) within the chip enable period ($CE=V_{DD}$), even when the precharging FET $Q_{73}$ is turned off, the FETs $Q_{66}$ and $Q_{70}$ of the inverter of the level shifter circuit 18 are turned on by the r/w signal. Thus, the outputs of the respective inverters are unchanged and at the GND level, and hence the driver FET $Q_{72}$ of the driver circuit 19 is turned off. Therefore, the output $d_{in}$ is held at the precharging level $V_{DD}-V_{th}$.

In the write operation mode (period $t_2$ in FIG. 14), the r/w signal is at the GND level and hence the FETs $Q_{66}$ and $Q_{70}$ connected in parallel with the driving FETs $Q_{65}$ and $Q_{69}$ of the input and next stage inverters of the level shifter 18 are both turned off. Then, the output of this data-in amplifier is determined by the input signal $D_{in}$. Namely, when the input signal $D_{in}$ is at the GND level as shown in the figure, the driver FET $Q_{65}$ of the input stage inverter of the level shifter controlled by this input is turned off to provide an output of the $V_{DD}$ level. Then, the driver FET $Q_{69}$ of the next stage inverter ($Q_{68}$ and $Q_{69}$) controlled by this output is turned on to hold the output at the GND level. Thus, the FETs $Q_{71}$ and $Q_{72}$ of the driver circuit 19 controlled by the outputs (GND and $V_{DD}$ levels) of the next stage inverter ($Q_{68}$ and $Q_{69}$) and the input stage inverter ($Q_{64}$ and $Q_{65}$) are turned off and on, respectively. As a result, the GND level is provided at the output $d_{in}$. At this timing, the $\overline{r/w}$ signal becomes of $V_{DD}$ level to perform write operation into a selected memory cell.

Now, referring to the memory circuit comprising memory cells each including three transistors as shown in FIG. 4, the voltage $V_Z$ at the node Z on the digit line $l_D$ changes from the $V_{DD}-V_{th}$ level to the GND level in the read operation mode by the data stored in the memory cell as shown in FIG. 14 (period $t_1$). Here, when the data stored in the memory cell is opposite, the voltage $V_Z$ is held at the precharging level.

When the read operation is terminated, precharging is performed again by turning on the FET $Q_{73}$. Here, the r/w signal is at the $V_{DD}$ level to turn on the FETs $Q_{66}$ and $Q_{70}$ as described before. The output $d_{in}$ is thus held at the $V_{DD}-V_{th}$ level (period $t_1'$).

Next, the write operation will be described below. In the period $t_2$ of FIG. 14, the output $d_{in}$ of the data-in amplifier becomes of GND level in correspondence to the input signal $D_{in}$. Thus, the voltage $V_Z$ on the digit line $l_D$ becomes of GND level in correspondence to the input signal $D_{in}$ and the information is written into the memory cell.

In short, according to the data-in amplifier of this embodiment, the output $d_{in}$ of the data-in amplifier is forcedly held at the precharging level (i.e. $V_{DD}-V_{th}$ level) except in the read/write operation. Therefore, the following advantages are provided.

(1) In the precharging operation ($\overline{CE}=V_{DD}$), the output $d_{in}$ of the data-in amplifier is held at the $V_{DD}-V_{th}$ level. Therefore, even when noise is superposed on the $\overline{r/w}$ signal to turn on the gate transfer FET, the precharging level on the digit line is free from the accidental drop. Therefore, the utilization factor of the supply voltage is good.

(2) Since the precharging level never drops, the voltage at the node (point Z in FIG. 4) with the digit line of the refreshing circuit also never drops. Thus, the level at the node is held sufficiently above the threshold voltage $V_{LT}$ of the read amplifier $A_1$ and hence no erroneous reading can arise.

(3) As a result, the reliability is improved and the flexibility of design is increased.

FIG. 13 shows an alternation of the circuit of FIG. 12, which is based on the similar technical concept.

As shown in the figure, a first inverter comprising FETs $Q_{73}'$ and $Q_{74}$ and a second inverter comprising FETs $Q_{76}$ and $Q_{77}$ are cascade-connected and an FET $Q_{75}$ controlled by the chip non-selection signal $\overline{CE}$ is connected in parallel with the driving FET $Q_{74}$ of the first inverter to constitute a level shifter circuit 20. A load FET $Q_{78}$ controlled by the output of the second inverter, a driving FET $Q_{79}$ controlled by the output of the first inverter, and a switching FET $Q_{81}$ controlled by the $\overline{r/w}$ signal are connected in series and another FET $Q_{80}$ controlled by the chip non-selection signal $\overline{CE}$ is connected in parallel with the load FET $Q_{78}$ to constitute a driver circuit 21. An input signal $D_{in}$ is applied to the level shifter circuit and an output $d_{in}$ is derived from the driver circuit 21. This circuit may be easily understood by comparison with the circuits of FIGS. 4, 10 and 12.

The timing chart for this circuit is the same as FIG. 14. Thus, repeated description will be omitted. In short, the FETs $Q_{75}$ and $Q_{80}$ applied with the $\overline{CE}$ signal assure the high state of the output $d_{in}$ in the chip non-selection period and the FET $Q_{81}$ applied with the $\overline{r/w}$ signal allows the output $d_{in}$ to fall only in the write operation.

The embodiments of FIGS. 12 and 13 can be applied, for example, to the inverting cell type MIS dynamic RAM disclosed in copending U.S. Pat. application Ser. No. 692,336, abandoned, of the same assignee filed on June 3, 1976 based on Japanese Pat. application No. 50-66562.

In the above description, data-in amplifiers receiving input signal $D_{in}$ of TTL level have been described. However, it will be apparent that this invention is equally applicable to those receiving an input signal $D_{in}$ of the MIS level. In such a case, the circuit having been referred to as the level shifter will be called input circuit.

Although all the FETs in the above embodiments are of n-channel enhancement mode type, p-channel enhancement mode type may also be used. In such a case, the polarity of the voltage sources should be reversed.

Further, the memory circuits capable of embodying the data-in amplifier of this invention are not limited to those disclosed in the above description. This invention can be widely applied to memory circuits.

What is claimed is:

1. Data-in means in a MIS memory device including precharge means for supplying an operating voltage to a plurality of data lines and memory cells being coupled to said data lines and having read and write modes, comprising an input circuit including a plurality of MIS inverter stages each connected between a terminal of the operating voltage and a terminal of a reference potential, and a driver circuit:

said input circuit comprising a first inverter and a second inverter cascade-connected to the first inverter;

each of said inverters including a driving FET having one of a pair of conduction electrodes connected to said reference potential terminal, a load FET connected between the other conduction electrode of said driving FET and said operating voltage terminal, and an FET connected in parallel with said driving FET and having a gate applied with a read-and-write command signal for coupling the inverter output to the reference potential, the driving FET of said first inverter having a control electrode applied with an information signal;

said driver circuit comprising at least one ratioless MIS inverter which comprises a first FET having one of a pair of conduction electrodes connected to said reference potential terminal and a gate applied with the output of said first inverter, a second FET having a pair of conduction electrodes connected to the other conduction electrode of said first FET and to said operating voltage terminal, respectively, and a control electrode applied with the output of said second inverter, and a third FET connected in parallel with said second FET and controlled to turn on in the non-selection mode of the memory, the output of said data-in means being derived from the connection node of said first and second FETs.

2. Data-in means according to claim 1, wherein said driver circuit further comprises a second ratioless MIS inverter comprising a fourth FET having one of a pair of conduction electrodes connected to said reference potential terminal and a control electrode applied with the output of said second inverter, a fifth FET having a pair of conduction electrodes connected to the other conduction electrode of said fourth FET and to said operating voltage terminal, respectively, and a control electrode applied with the output of said first inverter, and a sixth FET connected in parallel with said fifth FET and controlled to turn on in the non-selection mode of the memory, the connection node of said fourth and fifth FETs providing such output which is in the opposite state in the write mode to and in the same state in other modes as that of the output from the connection node of said first and second FETs.

3. Data-in means according to claim 2, wherein said driver circuit further comprises a seventh FET connected between the connection node of the first and second FETs and the connection node of the fourth and fifth FETs and controlled to turn on in the non-selection mode of the memory for ensuring the level equalization of the pair outputs of the data-in means in the non-selection mode.

4. Data-in means according to claim 1, wherein each of said first and second inverters of said input circuit further includes a bootstrap capacitor connected between said connection node and the gate of said load FET, and a reverse current blocking FET connected between said gate of the load FET and a terminal of the memory control signal and having a gate coupled to said operating voltage terminal.

5. Data-in means for use in a MIS memory device including precharge means for supplying an operating voltage to a plurality of data lines and memory cells being coupled to said data lines and having read and write modes, comprising a level shifting means including a first MIS inverter applied with information to be written in and a second MIS inverter cascade-connected to the first MIS inverter, and a driver means including at least one ratioless MIS inverter for amplifying the output of said level shifting means:

each of said first and second MIS inverters including a series connection of a driving MISFET and a load MISFET, the series connection connected between a terminal of an operating voltage and a terminal of a reference potential, and another MISFET connected in parallel with said driving MISFET and driven by a memory control signal in the disable period to bring the output of the inverter to a disabling level, the load MISFET controlled to be operative in the enable period of said memory control signal;

said ratioless inverter of the driver circuit including a first MISFET driven by the output of said first inverter, a second MISFET connected in series to said first MISFET and driven by the output of said second inverter, a third MISFET for coupling said first MISFET to said reference potential in the write mode, a fourth MISFET connected in parallel with said second MISFET to be commonly coupled to said operating voltage and controlled to turn on in the disable period of said control signal, and the connection node of the first and second MISFETs serving as an output terminal of the write means being held at the precharge voltage level except in the write mode.

6. Data-in means according to claim 5, wherein said driver circuit further includes a second ratioless inverter which generates a complementary output to that of said ratioless inverter in the write mode, the second ratioless inverter comprising:

a fifth MISFET driven by the output of the second inverter of said level shifting circuit, connected in series to said third MISFET and coupled to the reference potential in the write mode;

a sixth MISFET connected between said fifth MISFET and said operating voltage terminal and driven by the output of said first inverter of the level shifting circuit;

a seventh MISFET connected in parallel with said sixth MISFET and controlled to turn on in the disable period of said control signal; and the connection node between the fifth and sixth MISFETs generating a complement output of the data-in means, said two outputs being connected to pair data lines of each memory cell.

7. Data-in means according to claim 6, wherein said second ratioless inverter further comprises an eighth MISFET connected between the connection node of the first and second MISFETs and the connection node of the fifth and sixth MISFETs and controlled to turn on in the disable period of said control signal.

8. Data-in means according to claim 5, wherein said memory control signal is formed of the chip enable signal and the write command signal is applied to the gate of the third MISFET of said driver circuit.

9. A dynamic type semiconductor memory circuit comprising:

a memory cell having a first capacitance for storing a memory content;

a data line having a second capacitance connected to said memory cell;

precharge means coupled to said memory cell, thereby precharging said second capacitance with a predetermined voltage level through said data line during a first predetermined period;

data input terminal means for receiving a data input signal;

transfer means, coupled between said data line and said data input terminal means, for supplying said data signal to said data line therethrough during a second predetermined period in response to a control signal supplied thereto, said second predetermined period being different from said first predetermined period in time; and first means for holding said predetermined voltage level in said second capacitance during other periods except during said second predetermined period.

10. A dynamic type semiconductor memory circuit according to claim 9, wherein said predetermined voltage level is substantially equal to a voltage of the power supply for energizing said memory cell.

11. A dynamic type semiconductor memory circuit according to claim 10, wherein said precharge means includes a first FET connected between said power supply and said data line and controlled by a chip enable signal during said first predetermined period so as to conduct power through said first FET, and said transfer means comprises a second FET controlled by said control signal.

12. A dynamic type memory circuit having a plurality of memory cells arranged in the form of matrix of rows and columns each of said memory cells including four FETs, the first and second of the four FETs being cross-coupled while the third and fourth FETs form loads for the cross-coupled first and second FETs, comprising:

a plurality of word lines arranged parallel to each other along said rows of the matrix, each of said plural word lines being connected to respective ones of said cells arranged in each of said rows of the matrix;

a plurality of digit lines arranged parallel to each other along said columns of the matrix, said plural digit lines being in pairs each of which is commonly coupled to said memory cells arranged in each of said columns;

first decoder means for supplying first control signals for designating one of said plural word lines;

second decoder means for supplying second control signals for designating one of said pairs of the plural digit lines;

precharge means for applying a first fixed potential level to said digit lines during a first predetermined period;

a data-in circuit for producing complementary data output signals at output terminals thereof;

transfer means, coupled between said respective pairs of the digit lines and said output terminals of the data-in circuit, for transfering said complementary data signals of the data-in circuit to a selected pair of said digit lines during a second predetermined period in response to said second control signals; and wherein said data-in circuit has means for supplying said first fixed potential level to said output terminals thereof during other periods except during said second predetermined period.

13. A dynamic type memory circuit according to claim 12, wherein said first fixed potential level is substantially equal to a voltage of the power supply for energizing said memory cells.

14. A dynamic type memory circuit according to claim 12, wherein said data-in circuit comprises a complementary switching circuit for forming said complementary output signals, and a clamping circuit, combined with said driver circuit, for clamping both of said output terminals to said first fixed potential level.

15. A dynamic type memory circuit according to claim 14, wherein said complementary switching circuit comprises a first inverter coupled with an input signal, a second inverter receiving the output of said first inverter, two switching series circuits each including first and second switching elements connected in series, first wiring means for receiving the output of said first inverter at said second switching element of one of the switching series circuits and said first switching element of the other switching series circuit, second wiring means for receiving the output of said second inverter at said first switching element of said one switching series circuit and said second switching element of said other switching series circuit, and third wiring means for connecting the nodes between the first and second switching elements in said first and second series circuits to said output terminals, respectively, and wherein said clamping circuit comprises means for shorting said first and second wiring means, and means for providing said first fixed potential level to said output terminals.

16. A dynamic type memory circuit according to claim 12, further comprising:
sense amplifier means connected between a pair of digit lines in each of said pairs of digit lines.

17. A dynamic type semiconductor memory circuit comprising:
a plurality of memory cells;
data line means commonly coupled to said memory cells;
first means for holding said data line means to an operating voltage level for said memory cells during a first predetermined period;
input terminal means for receiving an input data signal to be stored in said memory cells;
coupling means, coupled between said data line means and said data terminal means, for supplying the data signal of said data input terminal means to a selected one of said data line means during a second predetermined period in response to a control signal supplied thereto, said second predetermined period being different from said first predetermined period in time;
second supplying means for supplying said data input terminal means with a voltage level substantially equal to said operating voltage level during all the periods except during said second predetermined period, whereby the held operating voltage level of said data line means is free from the influence of an output voltage level at said data input terminal means during said other periods.

18. A dynamic type memory circuit according to claim 17, wherein each one of said memory cells includes four FETs, the first and second of the four FETs being cross-coupled while the third and fourth FETs form loads for the cross-coupled pair.

19. A dynamic type MIS memory device having memory cells, data lines coupled to said cells, a data-in amplifier for writing information into said cells, and a transfer gate coupled between said data line and said data-in amplifier and being operative under a read-and-write command signal, wherein said data-in amplifier comprises means for holding the output of said data-in amplifier at a precharge potential level of said data line except in the write mode in response to said read-and-write command signal.

20. A MISFET memory device comprising:
a pair of output data terminals for deriving a pair of output data signals respectively having opposite phases;
a power supply voltage terminal;
a reference potential terminal;
a plurality of memory cells arranged in a matrix of rows and columns, each of said memory cells including four MISFETs, the first and second of the four MISFETs being cross-coupled while the third and fourth MISFETs form loads for the cross-coupled pair;
a plurality of word lines arranged in parallel to each other each connected to a plurality of said cells arranged in a row;
an X-decoder circuit coupled to said word lines;
a plurality of digit lines, parallel to each other, arranged orthogonally to said word lines, a pair of said digit lines being operatively associated with each cell in a column of cells;
a plurality of Y-decoder circuits arranged in columns corresponded in each pair of said digit lines;
a plurality of sense amplifier circuits arranged in columns corresponded in each pair of said digit lines wherein each sense amplifier circuit has a pair of input terminals being respectively connected to said pair of digit lines and a pair of output terminals being respectively connected to said pair of data output terminals;
a plurality of precharge means arranged in a column corresponded in each pair of said digit lines, each precharge means comprising a fifth MISFET being connected between said power supply voltage terminal and one digit line in said pair of digit lines, a sixth MISFET being connected between said power supply voltage terminal and the other digit line in said pair of digit lines, a seventh MISFET being connected between said pair of digit lines, and a chip enable signal terminal being connected to the gate electrodes of said fifth, sixth, and seventh MISFETs;
a data-in amplifier circuit having an input data terminal and a pair of output terminals for deriving a pair of output signals respectively having opposite phases;
said data-in amplifier circuit comprising a level shifter circuit including a plurality of MIS inverter stages each connected between said power supply terminal and said reference potential terminal, and a driver circuit;
said level shifter circuit comprising a first inverter and a second inverter cascade-connected to the first inverter;
said first inverter including a first driving MISFET having one of a pair of conduction electrodes connected to said reference potential terminal, a gate electrode connected to said input data terminal, a first load MISFET connected between the other conduction electrode of said first driving MISFET and said power supply voltage terminal, and a first switching MISFET connected in parallel with said first driving MISFET and having a gate electrode coupled with a read-and-write command signal for coupling a first output node of said first inverter to said reference potential terminal;
said second inverter including a second driving MISFET having one of a pair of conduction electrodes connected to said reference potential terminal, a gate electrode connected to said first output node of said first inverter, a second load MISFET connected between the other conduction electrode of said second driving MISFET and said power supply voltage terminal, and a second switching MISFET connected in parallel with said second driving MISFET and having a gate electrode applied with said read-and-write command signal for coupling a second output node of said second inverter to said reference potential terminal;

said driver circuit comprising a first and a second ratioless MIS inverter and control means;

said first ratioless MIS inverter including an eleventh MISFET having one of a pair of conduction electrodes connected to said reference potential terminal and a gate electrode connected with said first output node, a twelfth MISFET having a pair of conduction electrodes connected to the other conduction electrode of said eleventh MISFET and to said power supply voltage terminal and a gate electrode connected to said second output node, and a thirteenth MISFET, connected in parallel with said twelfth MISFET, having a gate electrode connected to said chip enable signal terminal, a third output node between said eleventh and twelfth MISFETs being connected to one of said output data terminals of said pair of output data terminals;

said second ratioless MIS inverter including a fourteenth MISFET having one of a pair of conduction electrodes connected to said reference potential terminal and a gate electrode connected to said second output node, a fifteenth MISFET having a pair of conduction electrodes connected to the other conduction electrode of said fourteenth MISFET and to said power supply voltage terminal, respectively, and a gate electrode connected to said first output node, and sixteenth MISFET, connected in parallel with said fifteenth MISFET, having a gate electrode connected to said chip enable signal terminal, a fourth output node between said fourteeneth and fifteenth MISFETs being connected to the other output data terminal of said pair of output data terminals;

said control means comprising a control MISFET having a pair of conduction electrodes connected to said one output terminal and to said other output terminal, respectively, and a gate electrode connected to said chip enable signal terminal.

* * * * *